(12) United States Patent
Watanabe

(10) Patent No.: US 9,224,824 B2
(45) Date of Patent: Dec. 29, 2015

(54) DISPLAY DEVICE SUBSTRATE AND DISPLAY DEVICE EQUIPPED WITH SAME

(71) Applicant: Sharp Kabushiki Kaisha, Osaka (JP)

(72) Inventor: Kibou Watanabe, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/409,678

(22) PCT Filed: Jun. 20, 2013

(86) PCT No.: PCT/JP2013/003868
§ 371 (c)(1),
(2) Date: Dec. 19, 2014

(87) PCT Pub. No.: WO2014/002448
PCT Pub. Date: Jan. 3, 2014

(65) Prior Publication Data
US 2015/0187894 A1    Jul. 2, 2015

(30) Foreign Application Priority Data

Jun. 28, 2012   (JP) .................................. 2012-145677

(51) Int. Cl.
| | |
|---|---|
| *H01L 29/417* | (2006.01) |
| *G02F 1/1362* | (2006.01) |
| *G02F 1/1333* | (2006.01) |
| *G02F 1/1368* | (2006.01) |
| *H01L 27/12* | (2006.01) |
| *H01L 29/45* | (2006.01) |
| *H01L 29/786* | (2006.01) |

(52) U.S. Cl.
CPC .......... *H01L 29/4175* (2013.01); *G02F 1/1368* (2013.01); *G02F 1/133345* (2013.01); *G02F 1/136213* (2013.01); *G02F 1/136227* (2013.01); *G02F 1/136277* (2013.01); *H01L 27/124* (2013.01); *H01L 27/1225* (2013.01); *H01L 29/41733* (2013.01); *H01L 29/45* (2013.01); *H01L 29/7869* (2013.01); *G02F 2001/133302* (2013.01)

(58) Field of Classification Search
USPC .......................................................... 257/43
See application file for complete search history.

(56) References Cited

U.S. PATENT DOCUMENTS

| | | | | | |
|---|---|---|---|---|---|
| 5,995,178 | A | * | 11/1999 | Fujikawa | ............... G02F 1/1362 349/138 |
| 2004/0263706 | A1 | * | 12/2004 | Cho | .................. G02F 1/136286 349/43 |
| 2004/0263708 | A1 | * | 12/2004 | Cho | .................. G02F 1/136286 349/43 |
| 2010/0155733 | A1 | * | 6/2010 | Moon | ............... G02F 1/136227 257/59 |
| 2012/0061664 | A1 | * | 3/2012 | Yamazaki | ........... H01L 27/1225 257/43 |
| 2012/0086009 | A1 | * | 4/2012 | Shin | .................... H01L 27/1288 257/59 |
| 2012/0146035 | A1 | * | 6/2012 | Kuwabara | ........... H01L 27/1225 257/59 |
| 2014/0346496 | A1 | * | 11/2014 | Ro | ...................... H01L 27/1248 257/43 |

FOREIGN PATENT DOCUMENTS

JP    H9-127549 A    5/1997

* cited by examiner

*Primary Examiner* — Thao P Le
(74) *Attorney, Agent, or Firm* — Chen Yoshimura LLP

(57) ABSTRACT

This thin film transistor substrate is provided with: a drain electrode that is formed on an insulating film, and comprises copper; an interlayer insulating film formed on the drain electrode; and a pixel electrode that is formed in the contact hole, which is formed in the insulating film and the interlayer insulating film, and on the interlayer insulating film, and is electrically connected to the drain electrode via the contact hole. In a plan view of the contact hole, the drain electrode is formed inside part of the contact hole in such a manner that part of the drain electrode and part of the outer periphery of the contact hole are overlapping, and part of the pixel electrode and the drain electrode are electrically connected.

10 Claims, 15 Drawing Sheets

DISPLAY DEVICE SUBSTRATE AND DISPLAY DEVICE EQUIPPED WITH SAME

TECHNICAL FIELD

The present invention relates to a substrate for a display device in which a drain electrode and a pixel electrode are connected through a contact hole, and a display device provided with the same.

BACKGROUND ART

In recent years, active matrix liquid crystal display devices having advantages such as being thin and light, being able to be driven at low voltage, and having low power consumption are widely used as display panels for various electronic devices such mobile devices including mobile phones and portable gaming systems, and laptop computers.

Such an active matrix liquid crystal display device includes a TFT substrate having thin film transistors (hereinafter abbreviated as "TFTs") as switching elements, and a color filter substrate (hereinafter, "CF substrate") having colored layers and being bonded as an opposite substrate to the TFT substrate. A liquid crystal layer is provided between the TFT substrate and the CF substrate.

FIG. 20 is a plan view showing a configuration of one pixel on the TFT substrate of such a liquid crystal display device, and FIG. 21 is a cross-sectional view of FIG. 20 along the line E-E.

The TFT substrate 50 includes a glass substrate 60 as an insulating substrate, a plurality of data signal lines 51 (hereinafter, "source lines") formed on the glass substrate 60, and a plurality of scan signal lines 52 (hereinafter, "gate lines") intersecting with the source lines 51 to form a grid pattern. The TFT substrate 50 also has a plurality of auxiliary capacitance lines 53 extending in parallel with the plurality of gate lines 52. One pixel is provided at each intersection between the plurality of source lines 51 and gate lines 52.

Each pixel has a TFT 56 as a switching element having a source electrode 54 to which a source line 51 passing through the corresponding intersection is connected, and a gate electrode 55 to which a gate line 52 passing through the corresponding intersection is connected.

An insulating film 62 is formed on the gate electrode 55, the gate line 52, and the auxiliary capacitance line 53, and a drain electrode 64 of the TFT 56 is formed on the insulating film 62. An interlayer insulating film 69 including a protective film 65 and an organic film 68 (planarizing film) provided on the protective film 65 is formed on the drain electrode 64.

A pixel electrode 66 is formed on the interlayer insulating film 69, a contact hole 67 is formed in the interlayer insulating film 69, and a portion of the contact hole 67 contacts the drain electrode 64. The pixel electrode 66 is in contact with the drain electrode 64 in the contact hole 67, and thus, the pixel electrode 66 and the drain electrode 64 are electrically connected to each other (see Patent Document 1, for example).

RELATED ART DOCUMENTS

Patent Documents

Patent Document 1: Japanese Patent Application Laid-Open Publication No. H9-127549

SUMMARY OF THE INVENTION

Problems to be Solved by the Invention

Typically, the interlayer insulating film 69 is etched by patterning by photolithography by forming a mask pattern, exposing, developing, and etching, thereby forming a contact hole 67 in the interlayer insulating film 69, after which washing is performed by a washing fluid (an oxidant aqueous solution such as hydrogen peroxide). If the drain electrode 64 is made of copper, then as shown in FIG. 21, the washing fluid sometimes causes a film-loss portion 64a to be formed in the drain electrode 64.

When the pixel electrode 66 is formed on the surface in the contact hole 67 by forming a transparent conductive film made of an ITO film or the like by sputtering on the entire substrate and over the planarizing film and patterning the transparent conductive film by photolithography, as shown in FIG. 21, the film-loss portion 64a in the drain electrode 64 results in a disconnected portion 66a forming in the pixel electrode 66, and the disconnected portion 66a in the pixel electrode 66 is formed around the entire circumference of the contact hole 67. As a result, there was a problem that display anomalies occurred in the display device due to a connection defect occurring between the drain electrode 64 and the pixel electrode 66.

The present invention takes into consideration the above-mentioned problem, and an object thereof is to provide a substrate for a display device that can guarantee connection between the drain electrode and the pixel electrode even if a film-loss portion is formed in the drain electrode, and a display device provided with the same.

Means for Solving the Problems

In order to attain the above-mentioned object, a substrate for a display device according to the present invention includes: an insulating substrate; an auxiliary capacitance line formed on the insulating substrate; an insulating film formed on the auxiliary capacitance line; a drain electrode made of copper and formed on the insulating film; an interlayer insulating film formed on the drain electrode; and a pixel electrode formed on the interlayer insulating film and electrically connected to the drain electrode through a contact hole, wherein the contact hole is formed in the interlayer insulating film such that a side edge of the drain electrode is exposed by the contact hole, the contact hole further penetrating the insulating film in an area where the drain electrode is not present.

According to this configuration, even if a film-loss portion is formed in the drain electrode during the washing step after the formation of the contact hole, a pixel electrode is formed on the surface in the contact hole, and a disconnected portion is formed in the pixel electrode due to the film-loss portion in the drain electrode, a film-loss portion is not formed in the drain electrode during the washing step in portions of the contact hole where the drain electrode is not present. Thus, it is possible to prevent disconnection in the pixel electrode in the entire outer bound of the contact hole. As a result, it is possible to reliably connect the drain electrode to the pixel electrode through the contact hole, thereby preventing display anomalies resulting from connection defects between the drain electrode and the pixel electrode.

In a substrate for a display device of the present invention, the contact hole may be formed to expose the drain electrode and the insulating substrate, and the pixel electrode formed over the contact hole may be electrically connected to the drain electrode in the contact hole, the pixel electrode being in contact with the insulating substrate.

According to this configuration, the drain electrode is not present the portion of the contact hole where the insulating substrate exposed, and thus, during the washing step, no film-loss portion occurs in the drain electrode and no film-loss occurs in the insulating substrate. Thus, it is possible to prevent disconnection in the pixel electrode in the entire outer bound of the contact hole.

In a substrate for a display device of the present invention, an edge of the drain electrode may be disposed further inside the contact hole than an edge of the auxiliary capacitance line, the drain electrode covering the auxiliary capacitance line.

According to this configuration, when forming the contact hole, it is possible to prevent peeling of the auxiliary capacitance line, and thus, it is possible to prevent short-circuits resulting from the pixel electrode coming into contact with the auxiliary capacitance line.

In a substrate for a display device of the present invention, a penetrating hole may be formed in the drain electrode, with a portion of the contact hole overlapping penetrating hole in a plan view.

In a substrate for a display device of the present invention, the insulating substrate may be a glass substrate.

In a substrate for a display device of the present invention, may further include: a switching element having a semiconductor layer formed on the insulating film.

In a substrate for a display device of the present invention, the semiconductor layer may be an oxide semiconductor layer.

According to this configuration, compared to a switching element that has an amorphous silicon semiconductor layer, the switching element has a higher electron mobility and can be formed by a low temperature process.

In a substrate for a display device of the present invention, the oxide semiconductor layer may be made of indium gallium zinc oxide.

According to this configuration, in the switching element, it is possible to have excellent properties such as high mobility and low OFF current.

Also, the substrate for a display device of the present invention has an excellent property in that it is possible to reliably connect the drain electrode to the pixel electrode through the contact hole, thereby preventing display anomalies resulting from connection defects between the drain electrode and the pixel electrode. Therefore, the present invention can be suitably used in display device including the substrate for a display device of the present invention, and another substrate for a display device opposing the substrate for a display device, and in particular, the present invention can be suitably used in a liquid crystal display device.

Effects of the Invention

According to the present invention, the drain electrode to the pixel electrode are reliably connected to each other through the contact hole, thereby preventing display anomalies resulting from connection defects between the drain electrode and the pixel electrode.

DETAILED DESCRIPTION OF EMBODIMENTS

Embodiments of the present invention will be described in detail below with reference to drawings. The present invention is not limited to the embodiments below.

Embodiment 1

Figure 1:
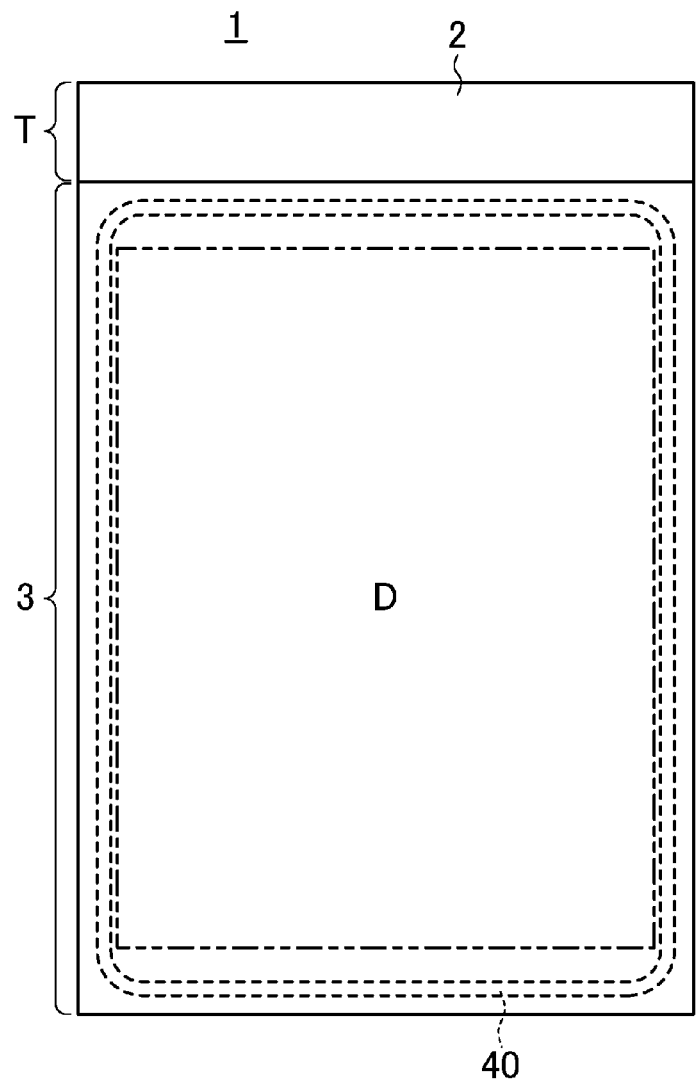
FIG. 1 is a plan view showing an overall configuration of a liquid crystal display device according to Embodiment 1 of the present invention.
Figure 2:
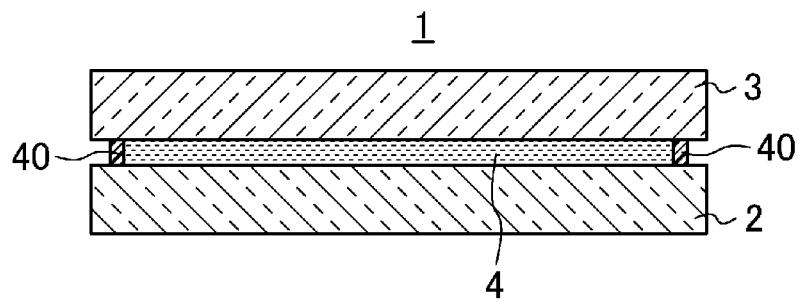
FIG. 2 is a cross-sectional view of the liquid crystal display device according to Embodiment 1 of the present invention.
Figure 3:
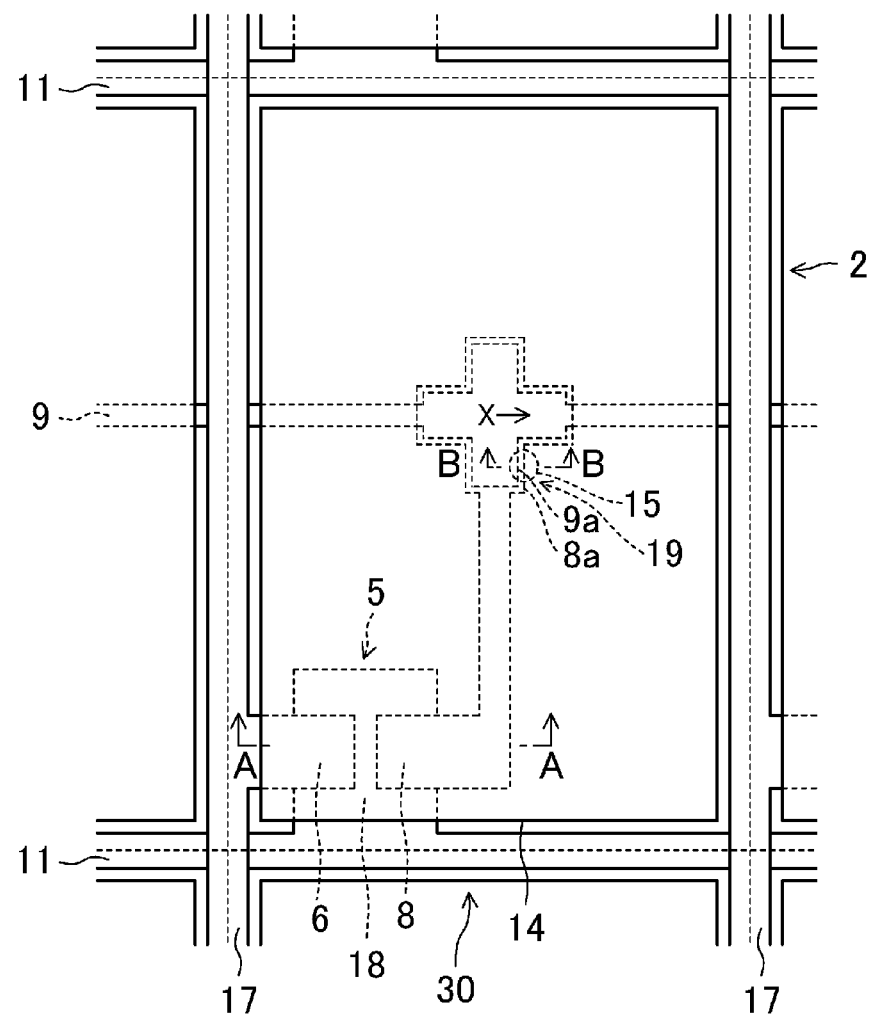
FIG. 3 is a plan view showing a pixel in the liquid crystal display device according to Embodiment 1 of the present invention.
Figure 4:
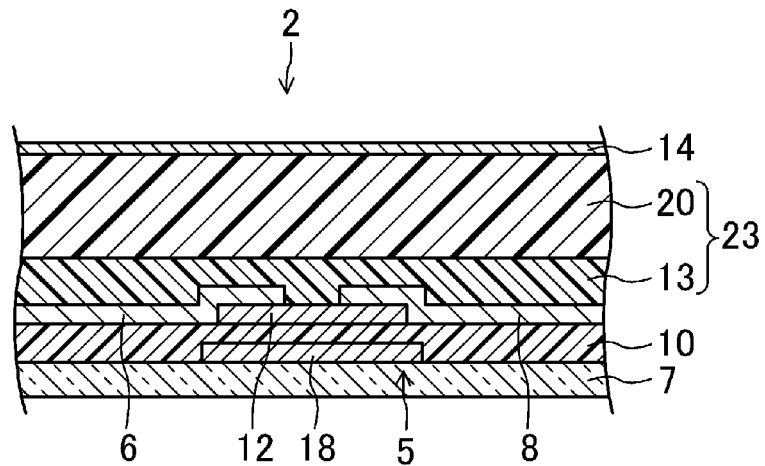
FIG. 4 is a cross-sectional view of FIG. 3 along the line A-A.
Figure 5:
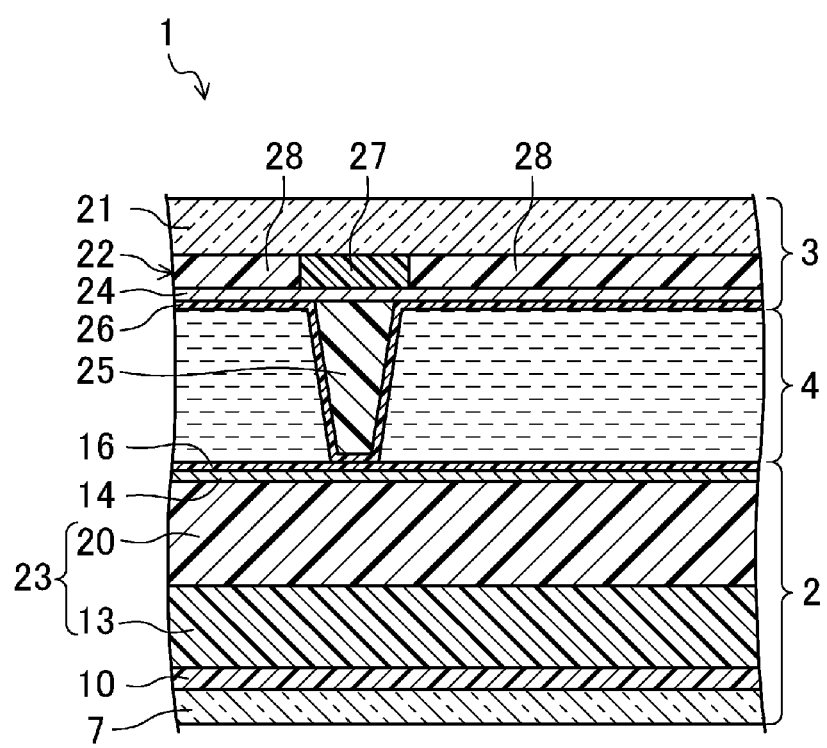
FIG. 5 is a cross-sectional view showing an overall configuration of a display unit of the liquid crystal display device according to Embodiment 1 of the present invention.
Figure 6:
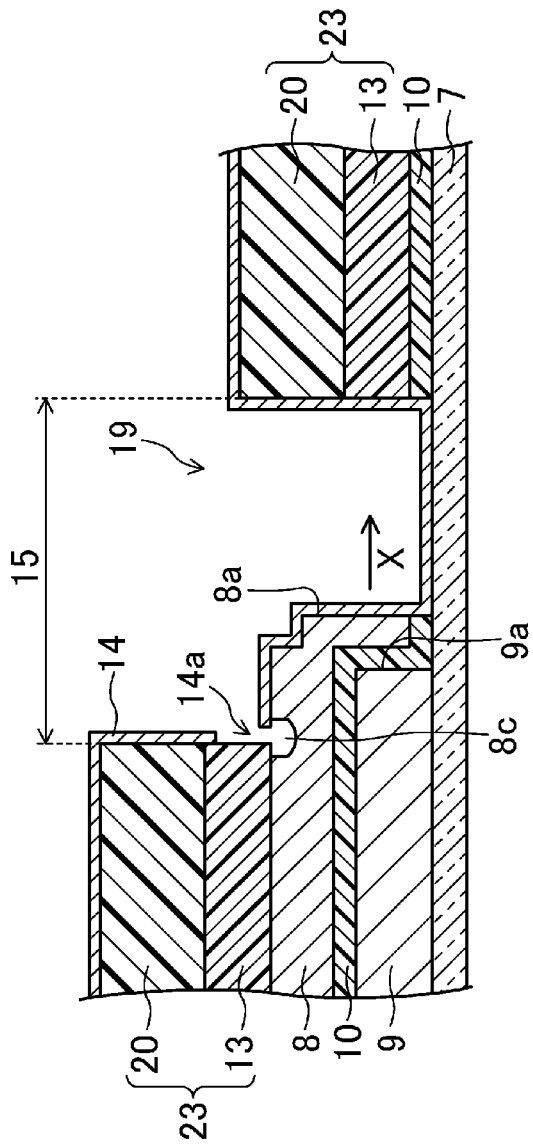
FIG. 6 is a cross-sectional view showing a contact region between a drain electrode and a pixel electrode in the liquid crystal display device according to Embodiment 1 of the present invention, and is a cross-section of FIG. 3 along the line B-B.

FIG. 1 is a plan view of an overall configuration of a liquid crystal display device according to Embodiment 1 of the present invention, and FIG. 2 is a cross-sectional view of the liquid crystal display device according to Embodiment 1 of the present invention. FIG. 3 is a plan view of a pixel in the liquid crystal display device according to Embodiment 1 of the present invention, and FIG. 4 is a cross-sectional view of FIG. 3 along the line A-A. FIG. 5 is a cross-sectional view of an overall configuration of a display unit in the liquid crystal display device according to Embodiment 1 of the present invention; FIG. 6 is a cross-sectional view showing a contact region between a drain electrode and a pixel electrode in the liquid crystal display device according to Embodiment 1 of the present invention, and is a cross-section of FIG. 3 along the line B-B.

As shown in FIGS. 1 and 2, the liquid crystal display device 1 includes a TFT substrate 2 that is a first substrate, a CF substrate 3 that is a second substrate opposing the TFT substrate 2, and a liquid crystal layer 4 that is a display medium layer sandwiched between the TFT substrate 2 and the CF substrate 3. The liquid crystal display device 1 also includes a sealing member 40 that is between the TFT substrate 2 and the CF substrate 3 and bonds the substrates together, the sealing member 40 being provided in a frame shape to seal in the liquid crystal layer 4.

The liquid crystal layer 4 is made of a nematic liquid crystal or the like having electrooptical properties, for example.

The sealing member 40 is formed to surround the liquid crystal layer 4 and bonds together the TFT substrate 2 and the CF substrate 3. The liquid crystal display device 1 includes a plurality of photospacers 25 for setting the thickness of the liquid crystal layer 4 (in other words, the cell gap).

Also, as shown in FIG. 1, the liquid crystal display device 1 is formed in a rectangular shape with the TFT substrate 2 protruding out from the CF substrate 3 in a direction along a side of the liquid crystal display device 1, and a plurality of display wiring lines including gate lines and source lines to be described later are drawn out to this protruding region to form a terminal region T.

In the liquid crystal display device 1, a display region D where images are displayed is defined as the region where the TFT substrate 2 and the CF substrate 3 overlap. The display region D is formed by arranging a plurality of pixels, which are the minimum image unit, in a matrix.

As shown in FIG. 1, the sealing member 40 is provided in a rectangular frame shape surrounding the entire display region D.

As shown in FIG. 3, in each pixel 30 provided in the liquid crystal display device 1, a source line 17 and a gate line 11 intersect. In other words, one pixel 30 is provided per intersection of the plurality of source lines 17 and gate lines 11.

In FIG. 3, only one pixel is shown, but there are actually a plurality of source lines 17 and gate lines 11, and a plurality of pixels 30 are arranged in a matrix, each of which is provided at each intersection between the plurality of source lines 17 and the plurality of gate lines 11. In other words, the pixels 30 are respectively provided in regions surrounded by the gate lines 11 and the source lines 17.

A TFT 5 (thin film transistor) is provided as a switching element in which the gate electrode 18 thereof is connected to the gate line 11 in the vicinity of the intersection between the lines, the source electrode 6 thereof is connected to the source line 17 in the vicinity of the intersection, and the drain electrode 8 thereof is connected to the pixel electrode 14.

When a corresponding gate line 11 is selected, the TFT 5 is ON, and when the corresponding gate line 11 is not selected, the TFT 5 is OFF. As shown in FIG. 3, the TFT 5 is provided at each intersection between the gate lines 11 and the source lines 17.

Also, in the present embodiment, a low resistance and low cost copper film is used as the metal film for the drain electrode 8.

The pixel electrode 14 is made of ITO (indium tin oxide), for example.

As shown in FIGS. 3 and 4, the TFT substrate 2 includes an insulating substrate 7 such as a glass substrate, a plurality of gate lines 11 extending in parallel with each other on the insulating substrate 7, and a gate insulating film 10 provided to cover the gate lines 11. The TFT substrate 2 also includes a plurality of source lines 17 extending in parallel with each other on the gate insulating film 10 in a direction perpendicular to the gate lines 11, and a plurality of TFTs 5 provided at respective intersections between the gate lines 11 and the source lines 17.

The TFT substrate 2 includes an interlayer insulating film 23 including a protective film 13 provided to cover the TFTs 5 and an organic film 20 (planarizing film) provided on the protective film 13, and pixel electrodes 14 provided on the interlayer insulating film 23.

As shown in FIG. 3, auxiliary capacitance lines 9 are formed to extend in parallel with the plurality of gate lines 11 on the TFT substrate 2. As shown in FIG. 6, the auxiliary capacitance lines 9 are formed on the insulating substrate 7, and drain electrodes 8 are formed over the auxiliary capacitance lines 9 across the gate insulating film 10.

As shown in FIG. 4, the TFT 5 includes a gate electrode 18 that protrudes sideways from the gate line 11, a gate insulating film 10 provided to cover the gate electrode 18, a semiconductor layer 12 provided in an island shape to correspond in position to the gate electrode 18 on the gate insulating film 10, and a source electrode 6 and drain electrode 8 provided to face each other on the semiconductor layer 12. The source electrode 6 protrudes sideways from the source line 17.

The semiconductor layer 12 is made of a silicon layer, and the lower layer thereof is made of an intrinsic amorphous silicon layer, and the upper layer thereof is made of an n$^+$ amorphous silicon layer doped with phosphorus, for example.

There is no special limitation on the materials for the gate insulating film 10 and the protective film 13, but examples thereof include silicon oxide ($SiO_2$) or silicon nitride ($SiN_x$ (x being an integer)). Examples of the material for the organic film 20 include a positive photosensitive acrylic resin that is insulating or a negative photosensitive resin that is insulating.

The contact region 19 (region where the contact hole is formed) between the drain electrode 8 and the pixel electrode 14 in the TFT substrate 2 is, as shown in FIGS. 3 and 6, where the pixel electrode 14 formed on the surface in the contact hole 15 and the drain electrode 8 are electrically connected to each other.

More specifically, as shown in FIG. 6, a portion of the contact hole 15 is in contact with the drain electrode 8, and in the contact hole 15, the pixel electrode 14 is in contact with the drain electrode 8, thereby forming an electrical connection therebetween. In other words, in the contact region 19 where the drain electrode 8 and the pixel electrode 14 are connected, the drain electrode 8 is connected to the pixel electrode 14 in the contact hole 15.

As shown in FIG. 5, the CF substrate 3 includes an insulating substrate 21 such as a glass substrate, a color filter layer 22 provided on the insulating substrate 21, a common electrode 24 provided to cover the color filter layer 22, a photospacer 25 having a pillar shape formed on the common electrode 24, and an alignment film 26 provided to cover the common electrode 24 and the photospacer 25.

The common electrode 24 is provided to oppose the pixel electrodes 14 provided on the TFT substrate 2. The color filter layer 22 includes colored layers 28 including a red layer R, a green layer G, and a blue layer B provided for respective pixels, and a black matrix 27 that is a light-shielding film.

The black matrix 27 is provided between adjacent colored layers 27, and has the role of separating the plurality of colored layers 28 from each other. Also, as shown in FIG. 5, the black matrix 27 is provided to oppose the interlayer insulating film 23 on the TFT substrate 2 across a photospacer 25.

The photospacer 25 is made of an acrylic photosensitive resin that is patterned by photolithography, for example. The black matrix 27 is made of a resin material having dispersed therein a black pigment such as carbon or a metal such as Ta (tantalum), Cr (chromium), Mo (molybdenum), Ni (nickel), Ti (titanium), Cu (copper), or Al (aluminum), or a resin material made by layering colored layers of a plurality of colors, each of which is light-transmissive.

As shown in FIG. 5, the TFT substrate 2 includes an alignment film 16 provided to cover the pixel electrodes 14.

In the liquid crystal display device 1, a liquid crystal capacitance is formed between the pixel electrodes 14 and the common electrode 24, and an auxiliary capacitance is formed between the pixel electrodes 14 and the auxiliary capacitance lines 9 provided along the gate lines 11.

Also, in the liquid crystal display device 1, one pixel 30 is provided per pixel electrode 14, and in each pixel 30, a source signal is sent from the source line 17 to travel through the source electrode 6 and the drain electrode 8, thereby causing a prescribed electric charge to be written to the pixel electrode 14, when a gate signal is sent from the gate line 11 to turn ON the TFT 5. Then a potential difference occurs between the pixel electrode 14 and the common electrode 24, causing a prescribed voltage to be applied to the liquid crystal layer 4.

In the liquid crystal display device 1, the orientation direction of liquid crystal molecules changes depending on the voltage applied, which causes the transmittance of light radiated from the backlight to be adjusted, thereby displaying images.

In the present embodiment, as shown in FIGS. 3 and 6, the characterizing feature is that the drain electrode 8 and the insulating substrate 7 are exposed through the contact hole 15 in a plan view, and in the contact hole 15, the pixel electrode 14 formed on the contact hole 15 and the drain electrode 8 are electrically connected to each other, and the pixel electrode 14 and the insulating substrate 7 are in contact with each other.

In other words, in the contact hole 15, the drain electrode 8 is formed in a portion of the contact hole 15 in a plan view, and a portion of the drain electrode 8 and a portion of the outer bound of the contact hole 15 overlap. Also, in the contact hole 15, a portion of the pixel electrode 14 and the drain electrode 8 are electrically connected to each other in a plan view. The outer bound of the contact hole 15 overlaps the drain electrode 8 and the insulating substrate 7 in a plan view.

As shown in FIG. 6, as a result of such a configuration, even if a film-loss portion 8c is formed in the drain electrode 8 during the washing step after the formation of the contact hole 15 and causes a disconnected portion 14a to be formed in the pixel electrode 14 when the pixel electrode 14 is formed on the surface in the contact hole 15, not all of the contact hole 15 overlaps the drain electrode 8 in a plan view as shown in FIG. 3, and the drain electrode 8 is not present in portions of the contact hole 15 where the insulating substrate 7 is exposed.

Therefore, during the washing step, no film-loss portion 8c in the drain electrode 8 is formed in the portion of the contact hole 15 where the insulating substrate 7 is exposed (in other words, where the drain electrode 8 is not present), and no film-loss occurs in the insulating substrate 7, and thus, it is possible to prevent a disconnection in the pixel electrode 14 from occurring along the entire outer bound of the contact hole 15.

Thus, even if the film-loss portion 8c forms in the drain electrode 8 in the contact region 19 and the film-loss portion 8c results in the disconnected portion 14a forming in the pixel electrode 14, the connection between the drain electrode 8 and the pixel electrode 14 can be maintained in the contact hole 15. As a result, it is possible to prevent display anomalies resulting from connection defects between the drain electrode 8 and the pixel electrode 14 from occurring.

Also, in the present embodiment, as shown in FIGS. 3 and 6, the outer shape of the drain electrode 8 in the contact hole 15 is larger in a plan view than the auxiliary capacitance line 9.

More specifically, the edge 8a of the drain electrode 8 is further inside the contact hole 15 (in the direction indicated by the arrow X in the drawing) than the edge 9a of the auxiliary capacitance line 9, and the drain electrode 8 covers the auxiliary capacitance line 9.

As a result of this configuration, when forming the contact hole 15 in the gate insulating film 10 and the interlayer insulating film 23, it is possible to prevent peeling of the auxiliary capacitance line 9, which can prevent short-circuits resulting from the pixel electrode 14 coming into contact with the auxiliary capacitance line 9.

Next, an example of a method of manufacturing the liquid crystal display device of the present embodiment will be described. FIGS. 7 to 13 are drawings for describing a method of manufacturing the liquid crystal display device according to Embodiment 1 of the present invention, and are cross-sections of FIG. 3 along the line B-B. The manufacturing method of the present embodiment includes a process of manufacturing the TFT substrate, a process of manufacturing the CF substrate, and a process of bonding together the substrates.

<Process of Manufacturing TFT Substrate>

Figure 7:
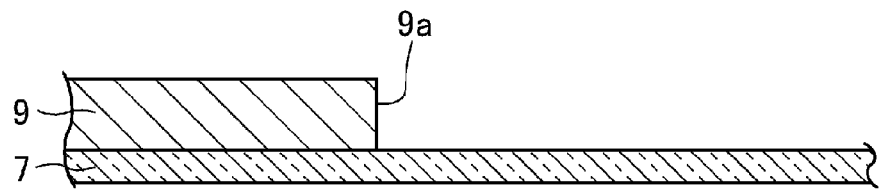
FIG. 7 is a drawing for describing a method of manufacturing the liquid crystal display device according to Embodiment 1 of the present invention.

As shown in FIG. 7, a copper film, for example, is sputtered on the entire insulating substrate 7, and then patterned by photolithography to form the auxiliary capacitance lines 9 to a thickness of approximately 4000 Å. At this time, as shown in FIGS. 3 and 4, the gate lines 11 and the gate electrodes 18 are formed simultaneously to this on the insulating substrate 7.

Figure 8:
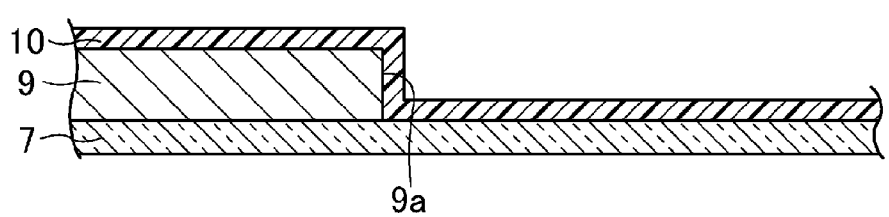
FIG. 8 is a drawing for describing a method of manufacturing the liquid crystal display device according to Embodiment 1 of the present invention.

Next, as shown in FIG. 8, on the entire substrate where the auxiliary capacitance lines 9, the gate lines 11, and the gate electrodes 18 are formed, a silicon nitride film or the like is formed by plasma CVD (chemical vapor deposition), for example, to form the gate insulating film 10 on the auxiliary capacitance line 9 to a thickness of approximately 400 nm. At this time, as shown in FIG. 4, the gate insulating film 10 is formed on the gate electrode 18.

Next, an intrinsic amorphous silicon film and an n$^+$ amorphous silicon film doped with phosphorus, for example, are successively formed by plasma CVD on the entire substrate on which the gate insulating film 10 has been formed. Then, the layered intrinsic amorphous silicon layer and n$^+$ amorphous silicon layer are patterned by photolithography in an island shape on the gate electrode 18, thereby forming a semiconductor formation layer. Next, the n$^+$ amorphous silicon layer of the semiconductor formation layer is etched to pattern the channel region, thereby forming the semiconductor layer 12 at a thickness of approximately 100 nm on the gate insulating film 10, as shown in FIG. 4.

Figure 9:
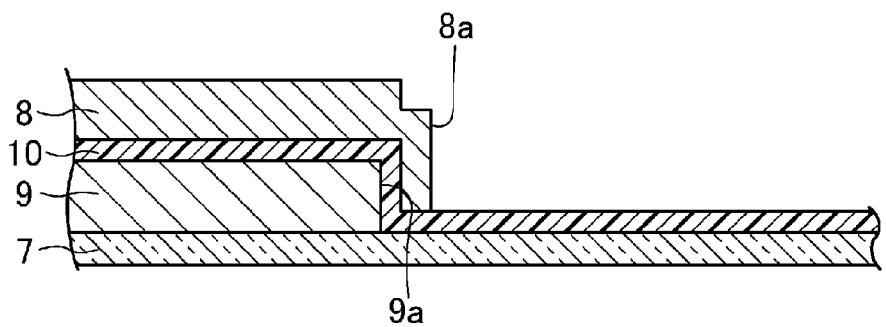
FIG. 9 is a drawing for describing a method of manufacturing the liquid crystal display device according to Embodiment 1 of the present invention.

As shown in FIGS. 4 and 9, a copper film, for example, is formed by sputtering on the entire substrate on which the semiconductor layer 12 has been formed, and then patterned by photolithography, thereby forming the drain electrode 8 to a thickness of approximately 400 nm on the semiconductor layer 12 and the gate insulating film 10. At this time, the source lines 17 and the source electrodes 6 are formed simultaneously to this, thereby completing the TFT 5 including the semiconductor layer 12.

Figure 10:
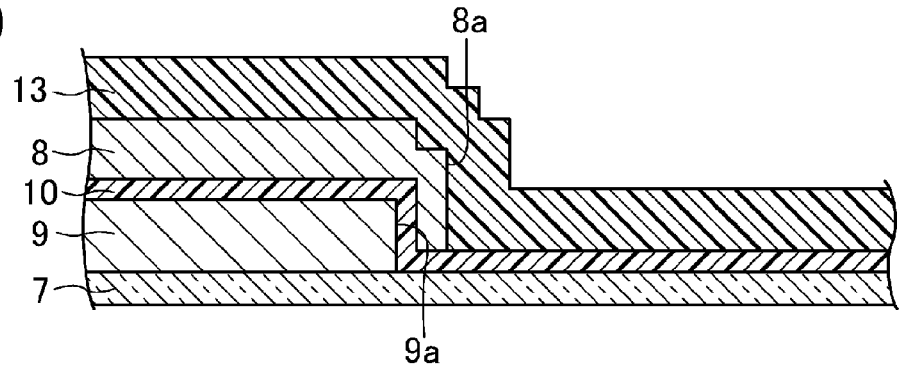
FIG. 10 is a drawing for describing a method of manufacturing the liquid crystal display device according to Embodiment 1 of the present invention.

Then, as shown in FIGS. 4 and 10, a silicon nitride film or the like is formed, for example, by plasma CVD on the entire substrate on which the TFTs 5 have been formed, thereby forming the protective film 13 to a thickness of approximately 200 nm on the TFT 5 and the drain electrode 8.

Figure 11:
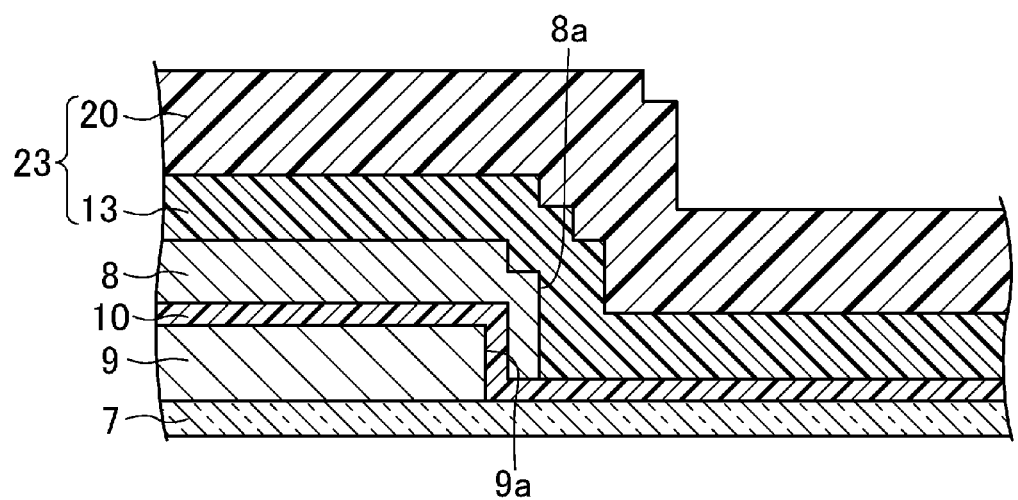
FIG. 11 is a drawing for describing a method of manufacturing the liquid crystal display device according to Embodiment 1 of the present invention.

Next, as shown in FIGS. 4 and 11, a positive photosensitive acrylic resin is formed on the entire substrate on which the protective film 13 has been formed, and is then patterned by photolithography, thereby forming the organic film 20 to a thickness of 3 μm on the surface of the protective film 13 and completing the interlayer insulating film 23, which includes the protective film 13 and the organic film 20.

Figure 12:
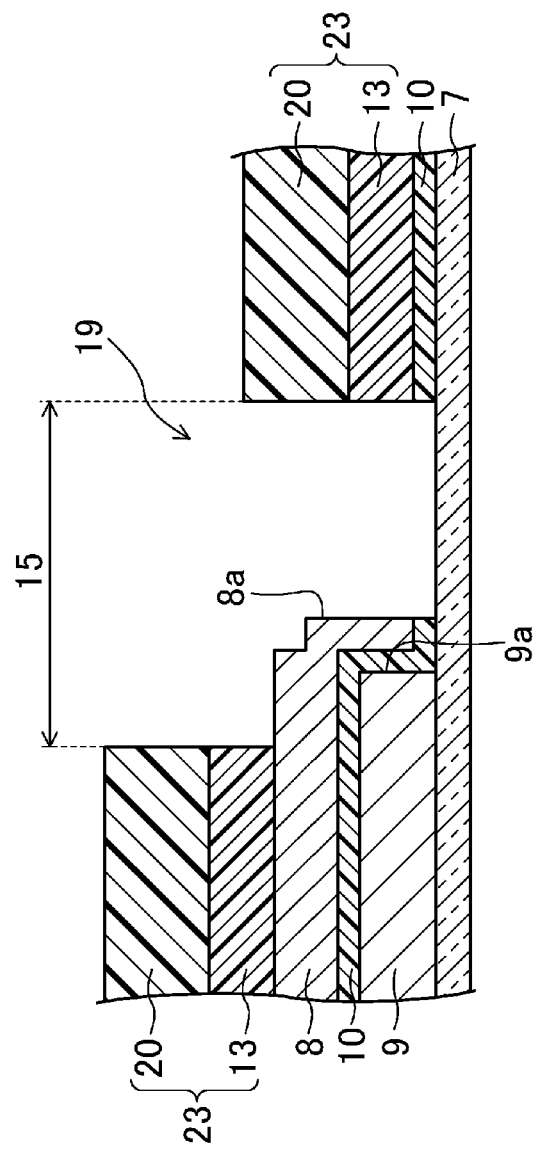
FIG. 12 is a drawing for describing a method of manufacturing the liquid crystal display device according to Embodiment 1 of the present invention.

Next, as shown in FIG. 12, by photolithography, a mask pattern is formed, exposure and developing are performed, and patterning by etching is performed on the interlayer insulating film 23 (that is, the protective film 13 and the organic film 20) and the gate insulating film 10 to form the contact holes 15.

At this time, as described above, the contact hole 15 is formed to expose the drain electrode 8 and the insulating substrate 7, and the outer bounds of the contact hole 15 overlap the drain electrode 8 and the insulating substrate 7 in a plan view.

Also, in the contact hole 15, the drain electrode 8 is formed in a portion of the contact hole 15 in a plan view, and a portion of the drain electrode 8 and a portion of the outer bound of the contact hole 15 overlap.

Next, a washing fluid (an oxidant aqueous solution such as hydrogen peroxide, ozone, or perchloric acid, for example) is used to wash the surface in the contact hole 15.

Figure 13:
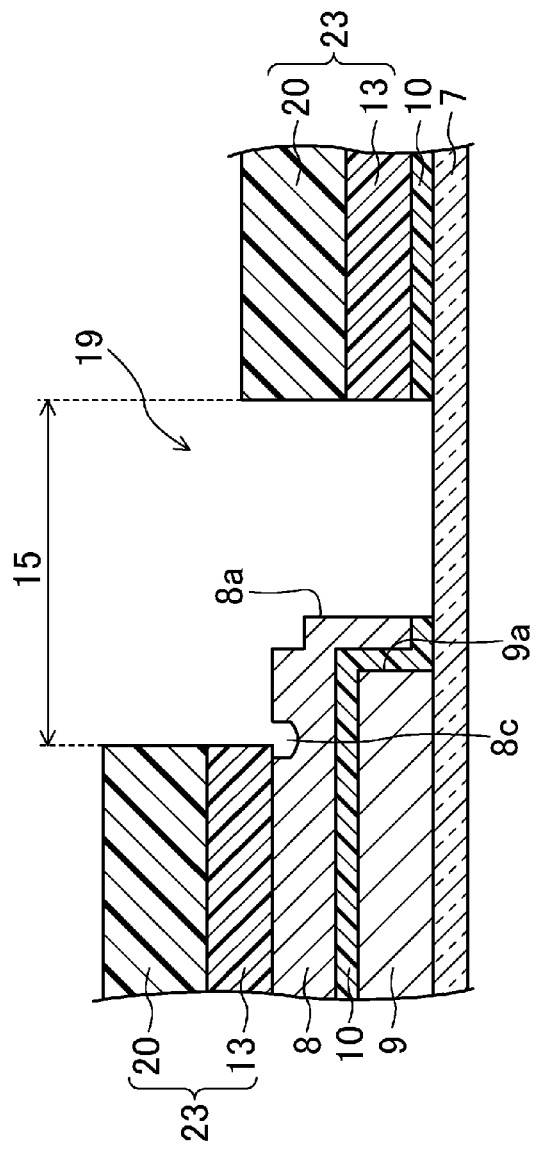
FIG. 13 is a drawing for describing a method of manufacturing the liquid crystal display device according to Embodiment 1 of the present invention.

At this time, as shown in FIG. 13, a film-loss portion 8c is formed in the drain electrode 8 at the boundary between the drain electrode 8 and the interlayer insulating film 23 as a result of washing by the washing fluid.

Next, a transparent conductive film such as an ITO film is sputtered onto the entire substrate on the interlayer insulating film 23, and then patterned by photolithography, thereby forming the pixel electrode 14 on the surface of the interlayer insulating film 23 and the surface in the contact hole 15 as shown in FIGS. 4 and 6.

As described above, the film-loss portion 8c is formed in the drain electrode 8 as shown in FIG. 6, and thus, when forming the pixel electrode 14 on the surface in the contact hole 15, the film-loss portion 8c in the drain electrode 8 results in a disconnected portion 14a being formed in the pixel electrode 14.

However, as described above, in the present embodiment, the contact hole 15 is formed to expose the drain electrode 8 and the insulating substrate 7, the pixel electrode 14 formed over the contact hole 15 and the drain electrode 8 are electrically connected to each other in the contact hole 15, and the pixel electrode 14 is in contact with the insulating substrate 7, and thus, not the entire contact hole 15 overlaps the drain electrode 8 in a plan view; the drain electrode 8 is not present in a portion of the contact hole 15 where the surface of the insulating substrate 7 is exposed.

Therefore, in the washing step described above, the film-loss portion 8c in the drain electrode 8 is not formed in the portion of the contact hole 15 where the insulating substrate 7 is exposed, and film-loss does not occur in the insulating substrate 7, and thus, it is possible to prevent a disconnection from occurring in the pixel electrode 14 along the entire outer bound of the contact hole 15.

Thus, even if the film-loss portion 8c forms in the drain electrode 8 in the contact region 19 and the film-loss portion 8c results in the disconnected portion 14a forming in the pixel electrode 14, the connection between the drain electrode 8 and the pixel electrode 14 can be maintained in the contact hole 15. As a result, it is possible to prevent display anomalies resulting from connection defects between the drain electrode 8 and the pixel electrode 14 from occurring.

Next, a polyimide resin is coated by printing onto the entire substrate on which the pixel electrodes 14 have been formed, and then rubbing treatment is performed thereon to form the alignment film 16 to a thickness of approximately 1000 Å.

In this manner, the TFT substrate 2 can be made.

<Process of Manufacturing CF Substrate>

First, a positive photosensitive resin having dispersed therein a black pigment such as carbon microparticles, for example, is coated by spin coating on the entire insulating substrate 21, and after exposing the coated photosensitive resin through a photomask, the photosensitive resin is then developed and heated, thereby forming the black matrix 27 to a thickness of approximately 2.0 μm.

Next, an acrylic photosensitive resin colored red, green, or blue, for example, is coated on the substrate on which the black matrix 27 has been formed, the coated photosensitive resin is exposed through a photomask, and then patterned by developing, thereby forming colored layers 28 (red layer R, for example) of selected colors to a thickness of approximately 2.0 μm. Then, similar steps are repeated for the other two colors, and the colored layers 28 of the other two colors (green layer G and blue layer B, for example) are formed to a thickness of approximately 2.0 μm, thereby forming the color filter layer 22 including the red layer R, the green layer G, and the blue layer B.

Next, an ITO film, for example, is formed by sputtering on the entire substrate on which the color filter layer 22 is formed, and is then patterned by photolithography, thereby forming the common electrode 24 to a thickness of approximately 1500 Å.

Next, an acrylic photosensitive resin is coated by spin coating on the entire substrate on which the common electrode 24 has been formed, and after exposing the coated photosensitive resin through a photomask, the photosensitive resin is developed, thereby forming the photospacers 25 to a thickness of approximately 4 μm.

Lastly, a polyimide resin is coated by printing on the entire substrate on which the photospacers 25 have been formed, and then, by performing rubbing treatment thereon, the alignment film 26 is formed to a thickness of approximately 1000 Å.

The CF substrate 3 can be made in the above-mentioned manner.

<Bonding Process>

First, a dispenser is used, for example, to draw the sealing member 40 made of a resin that is both ultraviolet curable and thermosetting onto the CF substrate 3 made in the process of manufacturing the CF substrate.

Next, liquid crystal is dripped into the region inside the sealing member 40 drawn on the CF substrate 3.

Next, the CF substrate 3 onto which the liquid crystal has been dripped and the TFT substrate 2 made in the process of manufacturing the TFT substrate are placed opposite each other and then bonded under reduced pressure. Then, the bonded substrates are released to atmospheric pressure, thereby pressurizing the front and rear surfaces of the bonded substrates, and as shown in FIG. 2, a liquid crystal layer 4 that is the display medium layer is provided between the TFT substrate 2 and the CF substrate 3.

Next, the sealing member 40 sandwiched between the substrates is irradiated with UV light, and then, the substrates with the sealing member 40 therebetween are heated to cure the sealing member 40.

It is possible to make the liquid crystal display device 1 shown in FIG. 1 as described above.

Embodiment 2

Figure 14:
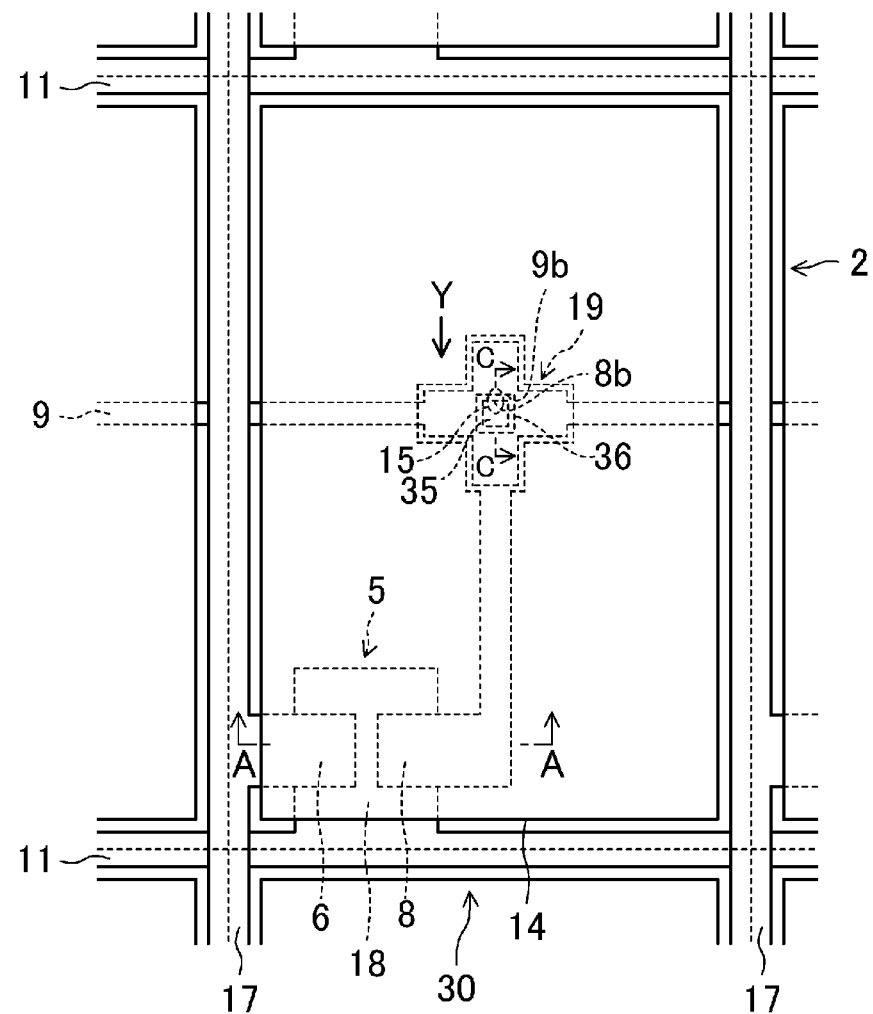
FIG. 14 is a plan view showing a pixel in the liquid crystal display device according to Embodiment 2 of the present invention.

Next, Embodiment 2 of the present invention will be described. FIG. 14 is a plan view showing a pixel in a liquid crystal display device according to Embodiment 2 of the present invention, and FIG. 15 is a cross-sectional view of a contact region between a drain electrode and a pixel electrode in the liquid crystal display device of Embodiment 2 of the present invention, FIG. 15 being a cross-section of FIG. 14 along the line C-C.

In the present embodiment, constituent portions similar to those of Embodiment 1 are assigned the same reference characters and descriptions thereof are omitted. Also, the configuration of the entire liquid crystal display device and thin film transistor substrate is similar to what was described in Embodiment 1 above, and thus, detailed descriptions thereof are omitted here.

Figure 15:
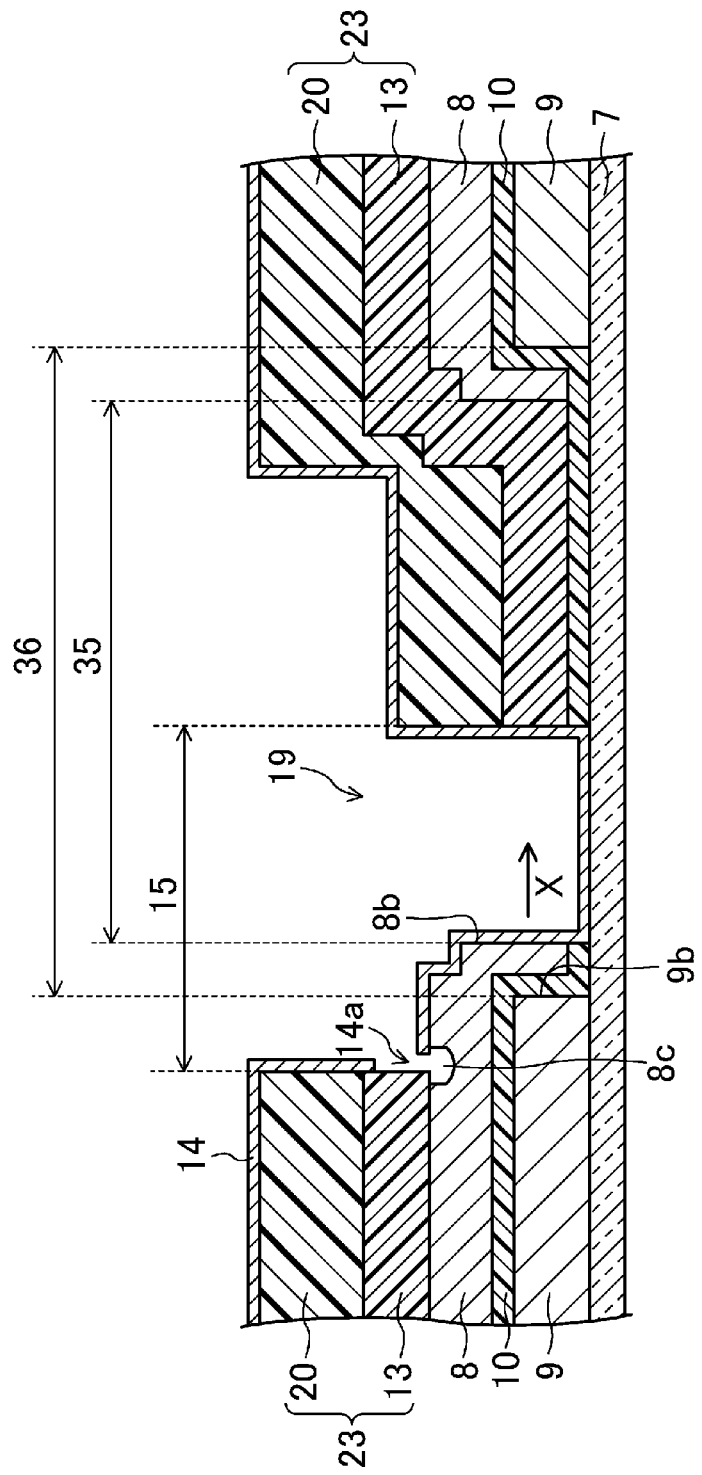
FIG. 15 is a cross-sectional view showing a contact region between a drain electrode and a pixel electrode in the liquid crystal display device according to Embodiment 2 of the present invention, and is a cross-section of FIG. 14 along the line C-C.

In the present embodiment, as shown in FIGS. 14 and 15, a characterizing feature is that a penetrating hole 35 is formed in the drain electrode 8 in the contact region 19, and a portion of the contact hole 15 overlaps the penetrating hole 35.

As shown in FIG. 15, with such a configuration, the insulating substrate 7 is exposed where the contact hole 15 and the penetrating hole 35 overlap, and like Embodiment 1, the pixel electrode 14 formed over the contact hole 15 and the drain electrode 8 are electrically connected to each other in the contact hole 15, and the pixel electrode 14 is in contact with the insulating substrate 7. Therefore, not all of the contact hole 15 overlaps the drain electrode 8 in a plan view, and the drain electrode 8 is not present in the portion of the contact hole 15 where the insulating substrate 7 is exposed.

Therefore, in the washing step described above, the film-loss portion 8c in the drain electrode 8 is not formed in the portion of the contact hole 15 where the insulating substrate 7 is exposed, and film-loss does not occur in the insulating substrate 7, and thus, it is possible to prevent a disconnection from occurring in the pixel electrode 14 along the entire outer bound of the contact hole 15.

Thus, even if the film-loss portion 8c forms in the drain electrode 8 in the contact region 19 and the film-loss portion 8c results in the disconnected portion 14a forming in the pixel electrode 14, the connection between the drain electrode 8 and the pixel electrode 14 can be maintained in the contact hole 15. As a result, it is possible to prevent display anomalies resulting from connection defects between the drain electrode 8 and the pixel electrode 14 from occurring.

Also, as shown in FIGS. 14 and 15, in the present embodiment, a penetrating hole 36 is formed in the auxiliary capacitance line 9, and the penetrating hole 36 in the auxiliary capacitance line 9 is formed to be larger than the penetrating hole 35 of the drain electrode 8 in a plan view.

More specifically, like Embodiment 1, the edge 8b of the drain electrode 8 is further inside the contact hole 15 than the edge 9b of the auxiliary capacitance line 9 (direction along the arrow Y in the drawing), and the drain electrode 8 covers the auxiliary capacitance line 9.

As a result of this configuration, when forming the contact hole 15 in the gate insulating film 10 and the interlayer insulating film 23, it is possible to prevent peeling of the auxiliary capacitance line 9, which can prevent short-circuits resulting from the pixel electrode 14 coming into contact with the auxiliary capacitance line 9.

Also, when manufacturing the thin film transistor substrate of the present embodiment, first, the auxiliary capacitance lines 9 having the penetrating holes 36, the gate lines 11, the gate electrodes 18, and the gate insulating film 10 are formed on the insulating substrate 7, similar to Embodiment 1.

Next, like Embodiment 1, after forming the semiconductor layer 12, the drain electrode 8 having the penetrating hole 35, the source line 17, and the source electrode 6 are formed, thus completing the TFT 5 including the semiconductor layer 12.

Then, by performing steps similar to those of Embodiment 1, the TFTs 5 shown in FIG. 14 are formed, and then, the interlayer insulating film 23, the contact holes, and the pixel electrodes 14 are formed, thereby manufacturing the TFT substrate 2 of FIGS. 14 and 15.

The embodiments above may be modified in the following manner.

In the present invention, as long as the contact hole 15 is formed to expose the drain electrode 8 and the insulating substrate 7 in a plan view, the pixel electrode 14 formed over the contact hole 15 and the drain electrode 8 are electrically connected in the contact hole 15, and the pixel electrode 14 is in contact with the insulating substrate 7, then the contact hole 15 may be disposed anywhere.

Figure 16:
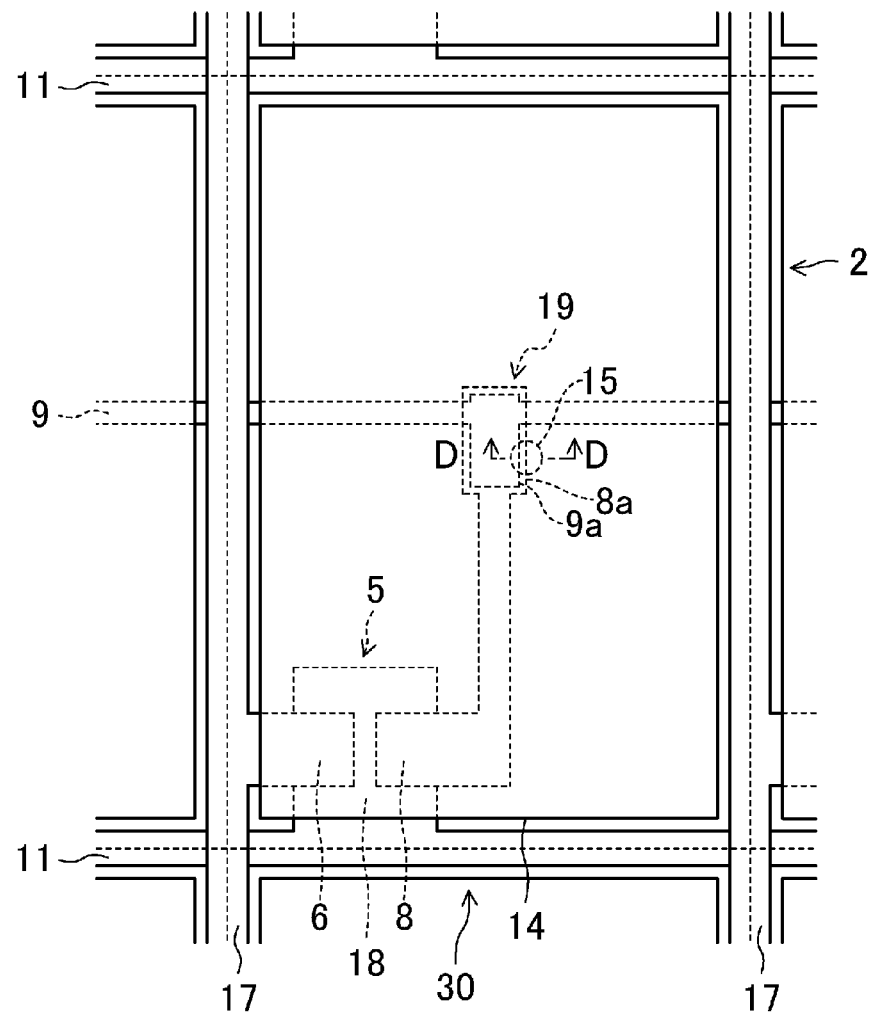
FIG. 16 is a drawing for describing a modification example of the arrangement of a contact hole in a liquid crystal display device according to an embodiment of the present invention.
Figure 17:
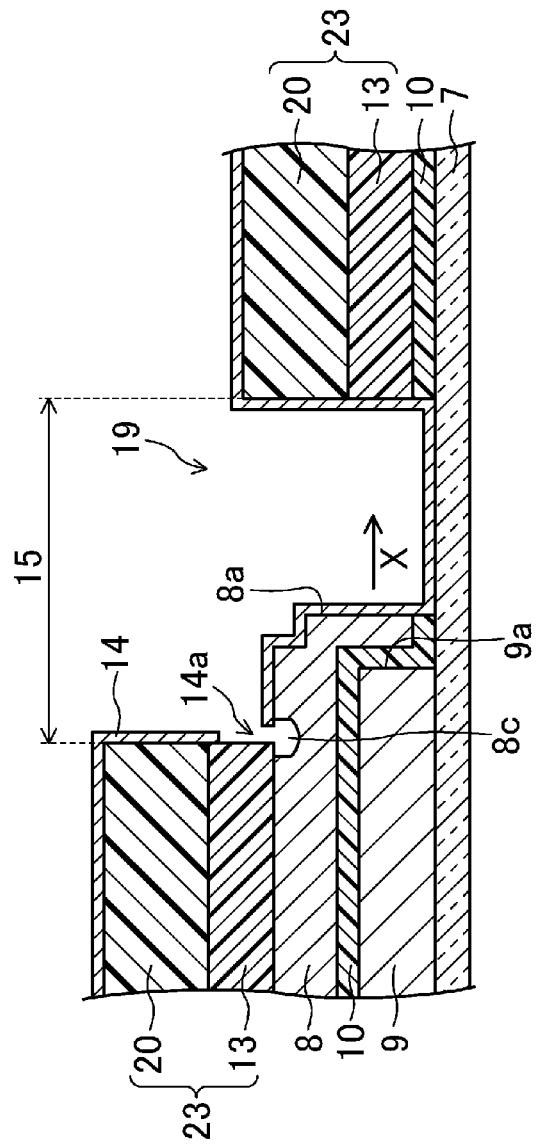
FIG. 17 is a cross-sectional view showing a contact region between a drain electrode and a pixel electrode in a liquid crystal display device of a modification example of the present invention.

For example, effects similar to those of Embodiment 1 can be attained even with the TFT substrate 2 having the drain electrode 8 pattern and the auxiliary capacitance line 9 pattern shown in FIG. 16 in which, as shown in FIGS. 16 and 17, the contact hole 15 is formed in the contact region 19 to expose the drain electrode 8 and the insulating substrate 7, the pixel electrode 14 formed over the contact hole 15 is electrically connected to the drain electrode 8 in the contact hole 15, and the pixel electrode 14 is in contact with the insulating substrate 7.

Also, in the embodiments above, a silicon-based semiconductor layer is used as the semiconductor layer, but the semiconductor layer is not limited thereto. An oxide semiconductor layer made of indium gallium zinc oxide may be used as the semiconductor layer in the TFT 5, for example, instead of the silicon-based semiconductor layer.

In such a case, first, the auxiliary capacitance lines 9, the gate lines 11, the gate electrodes 18, and the gate insulating film 10 are formed on the insulating substrate 7 in a manner similar to Embodiment 1.

Figure 18:
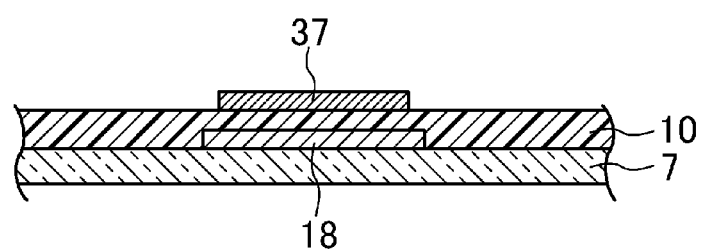
FIG. 18 is a drawing for describing a method of manufacturing the liquid crystal display device according to a modification example of the present invention.

Then, in a step of forming a semiconductor layer, an oxide semiconductor film (approximately 30 nm to 300 nm in thickness) made of indium gallium zinc oxide is formed by sputtering on the entire substrate on which the gate insulating film 10 has been formed. Then, by performing patterning, wet etching, and resist removal and washing by photolithography using a photomask, as shown in FIG. 18, the oxide semiconductor layer 37 is patterned.

Figure 19:
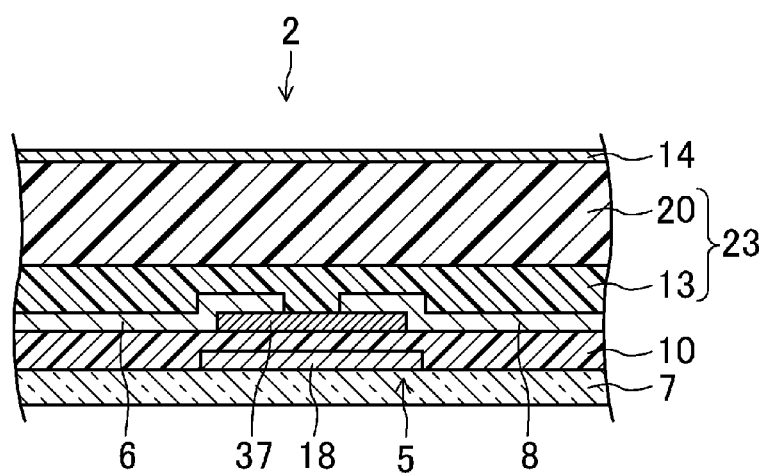
FIG. 19 is a drawing for describing a method of manufacturing the liquid crystal display device according to a modification example of the present invention.
Figure 20:
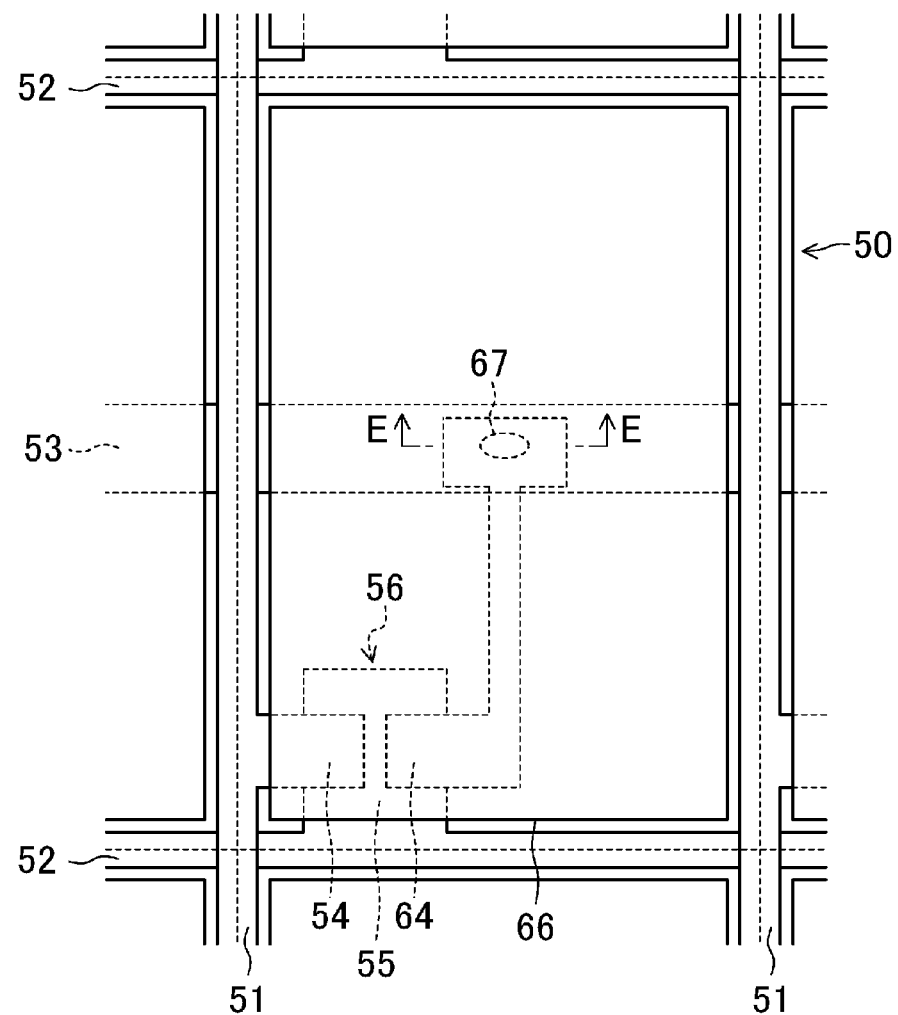
FIG. 20 is a plan view of a pixel in a conventional liquid crystal display device.
Figure 21:
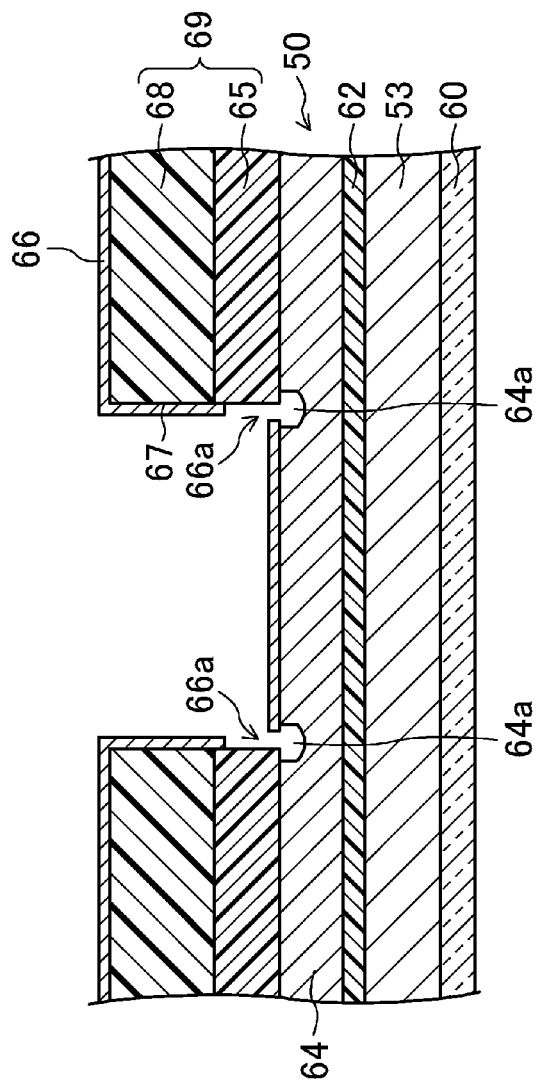
FIG. 21 is a cross-sectional view showing a contact region between a drain electrode and a pixel electrode in a conventional liquid crystal display device, and is a cross-section of FIG. 20 along the line E-E.

Next, by performing a process similar to that of Embodiment 1, the TFT 5 shown in FIG. 19 is formed, and then, the interlayer insulating film 23, the contact hole 15, and the pixel electrode 14 are formed, thereby making the TFT substrate 2 shown in FIGS. 1 to 3. Even with such a configuration, effects similar to Embodiment 1 can be attained.

An example was shown in which, in the TFT 5, the oxide semiconductor of the oxide semiconductor layer 37 is made of indium gallium zinc oxide by which excellent characteristics such as high mobility and low OFF current can be attained, but the oxide semiconductor may be of an In—Si—Zn—O type, an In—Al—Zn—O type, an In—Zn—O type, a Zn—Ti—O type, an Sn—Si—Zn—O type, an Sn—Al—Zn—O type, an Sn—Ga—Zn—O type, a Ga—Si—Zn—O type, a Ga—Al—Zn—O type, an In—Cu—Zn—O type, an Sn—Cu—Zn—O type, a Zn—O type, an In—O type, or the like.

In other words, the oxide semiconductor layer 37 is not limited to being an oxide semiconductor layer made of indium gallium zinc oxide, and may be made of a material made of a metal oxide including at least one of indium (In), gallium (Ga), aluminum (Al), copper (Cu), zinc (Zn), manganese (Mg), and cadmium (Cd).

The oxide semiconductor layer 37 made of these materials has a high mobility even when amorphous, and thus, it is possible to increase the ON resistance of the switching element. Thus, the difference in output voltage when reading data becomes large, and the S/N ratio can be improved. Other examples of an oxide semiconductor film besides In—Ga—Zn—O include $InGaO_3(ZnO)_5$, $Mg_xZn_{1-x}O$, $Cd_xZn_{1-x}O$, and CdO.

Also, in the embodiments above, a liquid crystal display device having a thin film transistor substrate was given as an example of a display device, but the present invention can also be applied to other display devices such as organic EL (electroluminescence) display devices, inorganic EL display devices, and electrophoretic display devices.

INDUSTRIAL APPLICABILITY

An example of a use for the present invention includes a substrate for a display device in which the drain electrode and the pixel electrode are connected through a contact hole, and a display device including this.

DESCRIPTION OF REFERENCE CHARACTERS 1 liquid crystal display device
2 TFT substrate (substrate for display device)
3 CF substrate (another substrate for display device)
4 liquid crystal layer
5 TFT (switching element)
6 source electrode
7 insulating substrate
8 drain electrode
8*a* edge of drain electrode
8*b* edge of drain electrode
9 auxiliary capacitance line
9*a* edge of auxiliary capacitance line
9*b* edge of auxiliary capacitance line
10 gate insulating film
11 gate line
12 semiconductor layer
13 protective film
14 pixel electrode
14*a* disconnected portion of pixel electrode
15 contact hole
16 alignment film
17 source line
18 gate electrode
19 contact region
20 organic film
23 interlayer insulating film
30 pixel
35 penetrating hole in drain electrode
36 penetrating hole in auxiliary capacitance line
37 oxide semiconductor layer
40 sealing member

What is claimed is:

1. A substrate for a display device, comprising:
an insulating substrate;
an auxiliary capacitance line formed on the insulating substrate;
an insulating film formed on the auxiliary capacitance line;
a drain electrode made of copper and formed on the insulating film;
an interlayer insulating film formed on the drain electrode; and
a pixel electrode formed on the interlayer insulating film and electrically connected to the drain electrode through a contact hole,
wherein the contact hole is formed in the interlayer insulating film such that a side edge of the drain electrode is exposed by the contact hole, the contact hole further penetrating the insulating film in an area where the drain electrode is not present.

2. The substrate for a display device according to claim 1, wherein the contact hole is formed to expose the drain electrode and the insulating substrate, and
wherein the pixel electrode formed over the contact hole is electrically connected to the drain electrode in the contact hole, the pixel electrode being in contact with the insulating substrate.

3. The substrate for a display device according to claim 1, wherein an edge of the drain electrode is disposed further inside the contact hole than an edge of the auxiliary capacitance line, the drain electrode covering the auxiliary capacitance line.

4. The substrate for a display device according to claim 1, wherein a penetrating hole is formed in the drain electrode, and a portion of the contact hole overlaps said penetrating hole in a plan view.

5. The substrate for a display device according to claim 1, wherein the insulating substrate is a glass substrate.

6. The substrate for a display device according to claim 1, further comprising:
a switching element having a semiconductor layer formed on the insulating film.

7. The substrate for a display device according to claim 6, wherein the semiconductor layer is an oxide semiconductor layer.

8. The substrate for a display device according to claim 7, wherein the oxide semiconductor layer is made of indium gallium zinc oxide.

9. A display device, comprising:
the display device according to claim 1; and
another substrate for a display device opposing said substrate for a display device.

10. The substrate for a display device according to claim 9, wherein the display device is a liquid crystal display device.

* * * * *